United States Patent [19]

Ingle et al.

[11] Patent Number: 4,470,670

[45] Date of Patent: Sep. 11, 1984

[54] METHOD AND DEVICE FOR INDICATING POINT OF CONTACT

[75] Inventors: Lloyd D. Ingle, Valley Center; Thomas C. Podvin, Poway, both of Calif.

[73] Assignee: The Microminipulator Microscope Co., Inc., Escondido, Calif.

[21] Appl. No.: 381,470

[22] Filed: May 24, 1982

[51] Int. Cl.³ .............................................. B23K 37/00
[52] U.S. Cl. ................................... 350/523; 228/56.5
[58] Field of Search .............................. 350/523–528; 228/103, 105, 56.5, 904; 219/121 LY, 121 LW, 121 LU, 121 LV; 356/375

[56] References Cited

U.S. PATENT DOCUMENTS

| | | | |
|---|---|---|---|
| 3,169,183 | 2/1965 | Radtke et al. | 350/523 |
| 3,186,296 | 6/1965 | Erban | 350/528 |
| 3,661,316 | 5/1972 | Kulicke et al. | 228/56.5 |
| 3,769,963 | 11/1973 | Goldman et al. | 219/121 LV |
| 4,088,890 | 5/1978 | Waters | 219/121 LY |
| 4,289,378 | 9/1981 | Remy et al. | 219/121 LV |
| 4,329,015 | 5/1982 | Feinbloom | 350/523 |

OTHER PUBLICATIONS

Peppers, N. A., "A Laser Microscope", App. Optics 5-1965, pp. 555–558.

*Primary Examiner*—William H. Punter
*Attorney, Agent, or Firm*—Fitch, Even, Tabin & Flannery

[57] ABSTRACT

A method and device for providing point of contact light or target on a work piece are provided which are particularly adapted for use with a wire bonder independent of the operator's viewing aid and which employ a high intensity light source to create a naturally colored beam of light. In accordance with one embodiment of the invention, a helium-neon laser beam is expanded and then formed into a point of light which is projected onto the work piece surface by an adjustable mirror arrangement which is positioned to reflect the specular component of the beam away from the operator's viewing sight line and which enables easy focusing and adjustment of the target spot so as to substantially reduce parallax.

6 Claims, 4 Drawing Figures

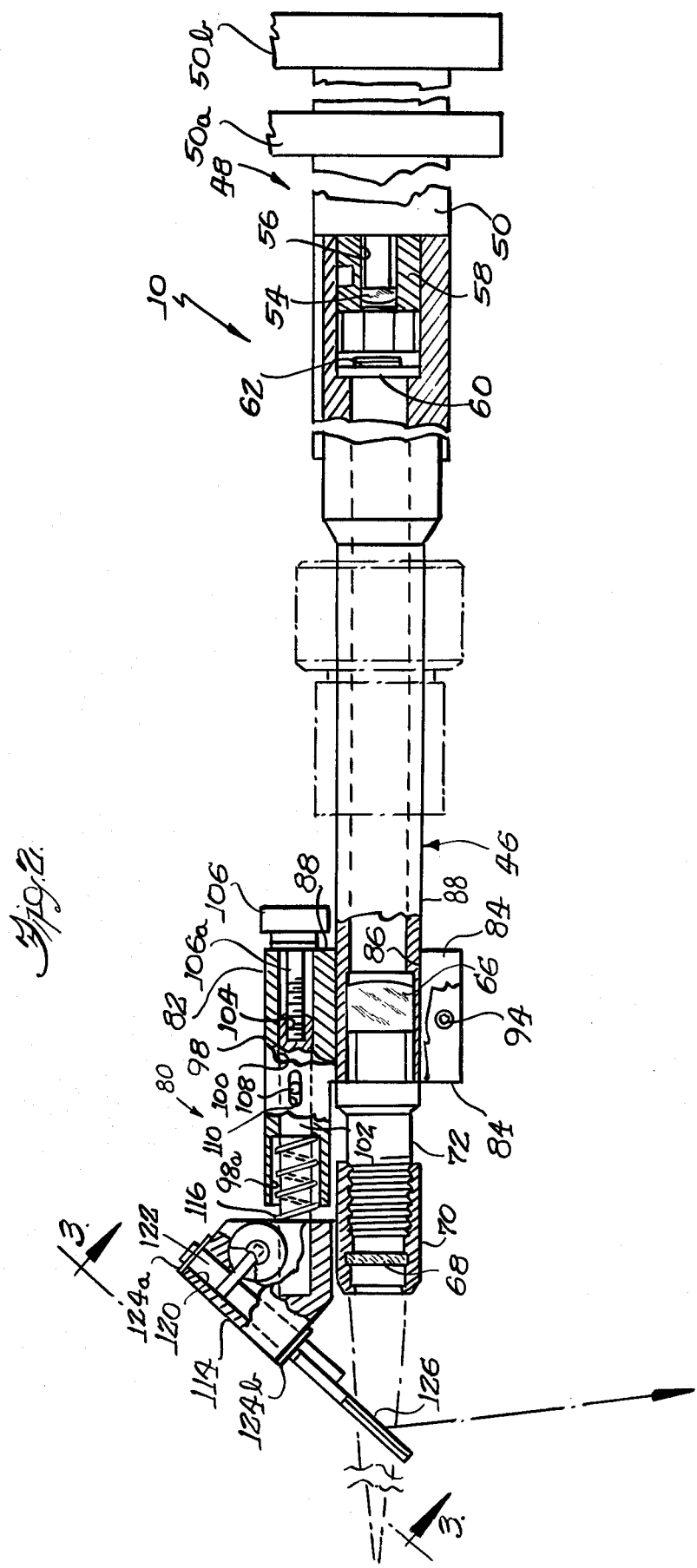

METHOD AND DEVICE FOR INDICATING POINT OF CONTACT

BACKGROUND OF THE INVENTION

The present invention relates generally to devices for providing a point of contact indicating target on the surface of a work piece, and more particularly to a novel method and device for providing a precise target point on a work surface at a position representing the working position of a tool when moved in a predetermined path from a position spaced from the work piece to a working position contacting the work piece.

With the advent of microelectronics and the rapid development of microprocessors employing integrated circuits and microelectronic chips or wafers, apparatus has been developed to facilitate design, development, analysis and assembly of the microelectronic chips, and particularly apparatus which enables bonding of a conductor wire to a conductive element on a microelectronic chip for connection to either a second point located within the boundary of the chip or a point external to the chip such as on a carrier board or lead frame. Such apparatus are generally termed wire bonders.

Wire bonding is basically a welding operation in which a weldment is formed between a conductive bonding wire or ribbon and a metallic conductive element or pad on the microelectronic chip or waver. The known wire bonders accomplish bonding generally in accordance with one of three basic principles; thermocompression ball bondings, thermosonic ball bonding and ultrasonic wedge bonding. In general, the wire bonder apparatus for carrying out any one of the three techniques includes a work support station enabling support of a work piece such as a microelectronic chip, a supply of generally continuous length bonding wire or ribbon such as a supported spool or reel of bonding wire, a bonding head having a bonding tool adapted for cooperation with the bonding wire and operable in a manner to effect engagement between a contact end or tail of the bonding wire and the work surface, and viewing means generally in the form of a microscope enabling magnified viewing of the work surface so as to enable accurate positioning of the work piece in relation to the bonding tool to effect a bonding connection at a predetermined desired location on the work piece.

To assist in viewing the work piece and enable accurate positioning thereof relative to the path traversed by the bonding tool as it is moved from a position spaced from the work piece to a position engaging the work piece during a bond connection, it is a common practice to provide illumination to the work piece in the form of a light source adapted to direct a white light onto the work piece. A significant problem exists with such known apparatus in that the sight line of the viewing microscope is generally inclined relative to a line perpendicular to the work surface so that establishing alignment between a predetermined position on the work piece and the point at which the bonding tool will make contact with the work piece is very difficult, particularly with the bonding tool spaced above the plane of the work surface as in a search level enabling the operator to move the work piece relative to the bonding tool without engaging the bonding tool.

In an attempt to both reduce the time required for an operator to accurately position a work piece relative to a bonding tool in the known wire bonder apparatus, point of contact indicating devices have been developed which are adapted to provide a target spot on a work surface, such as on a microelectronic chip, to enable the bonder operator to more readily align the work piece precisely beneath the bonding tool. In one known technique for indicating point of contact, a simple cross-line reticle is mounted in the fixed eyepiece of a microscope and is superimposed over the image of the work piece. Another technique employs an illuminated cross-line or other pattern which is directed into the optical system of the microscope and is also superimposed over the image of the workpiece. The known techniques or systems have the disadvantage that they are dependent upon the optical and mechanical stability of the microscope. Further, since virtually all microscopes have an image shift when focused or zoomed to a different magnification, any disturbance of the microscope generally requires that the cross-line be recalibrated.

More recent attempts at providing improved and more accurate point of contact indication on a work piece have employed incandescent lamps as light sources from which a target is projected onto the work surface to indicate point of contact. These devices have proven to be of only marginal usefulness due to the fact that the target spot is very dim and thus makes it very difficult for the operator to see the target spot, particularly where a white light illumination beam is being employed to illuminate the work piece surface beneath the viewing aid. Although incandescent lamps can be made bright enough that they can cause eye damage, they are very inefficient at producing a colored point of light for a number of reasons. For example, the radiation emitted by an incandescent lamp is emitted into a sphere and only a fraction of the useful light can be collected. Another reason is that the source of light in an incandescent lamp is a tungsten filament much larger than the final target spot desired so that substantial losses are incurred in optically reducing the size of the source. Still further, an incandescent lamp light source must be colored to produce a contrast with the white light generally emitted by microscope illuminators. Such coloring of incandescent light sources is conventionally done with optical filters which only transmit a small percentage of the visible radiation. Finally, of the radiation incident upon a work piece from an incandescent point of contact indicating device, only a small fraction is collected by the microscope objective lens because the target source light is scattered when it hits the work piece surface.

SUMMARY OF THE INVENTION

In accordance with the present invention, a method and device for providing point of contact indication on a work piece are provided which are independent of the operator's viewing aid and which employ a high intensity light source to create a naturally colored beam of light providing desired contrast with the illumination light projected on the work piece. The use of a high intensity light source for the point of contact indicator beam in accordance with the present invention eliminates geometrical radiation losses and because of its natural coloring does not produce spectral losses. The point of contact indicator device in accordance with the invention provides extremely long life and facilitates adjustment of the light intensity to optimize operator eye comfort while enabling mirror deflection to obtain a desired point of contact pattern. In accordance with one embodiment of the present invention, a helium-neon laser beam is expanded and then formed into a point of light which is projected onto the work piece surface in a manner to specularly reflect the main portion of the beam so as not to impinge upon the operator's eyes. This is accomplished by employing a mirror to reflect the specular component of the beam back into the instrument away from the operator's viewing sight line. Means are provided to adjust the beam of the indicator device to enable easy focusing of the target spot, and to adjust the source beam direction so as to substantially reduce parallax.

Accordingly, it is a general object of the present invention to provide a new and improved method and device for providing point of contact indication on a work piece which provides improved target spot indicator contrast and substantially reduces parallax problems exhibited by the known point of contact indicator devices.

A more specific object of the present invention is to provide a novel point of contact indicator device and method for using the same in conjunction with a wire bonder to facilitate highly accurate bond connection of conductor bonding wire to a conductive element on a work piece of a microelectronic chip as the operator views the work piece through a visual aid such as a microscope.

A feature of the point of contact indicator device in accordance with the present invention lies in the provision of a high-intensity light source such as a helium-neon laser the beam of which is expanded to a larger cross-sectional area and subsequently formed into a point of light which is directed onto the surface of the work piece by means enabling accurate aligment with the path of movement of a bonding tool preparatory to making a bond connection on a work piece.

Further objects, features and advantages of the present invention, together with the organization and manner of operation thereof, will become apparent from the following detailed description of the invention when taken in conjunction with the accompanying drawings wherein like reference numerals designate like elements throughout the several views.

BRIEF DESCRIPTION OF THE DRAWINGS

FIG. 2 is an enlarged foreshortened side elevational view of the point of contact indicator device employed in the wire bonder of FIG. 1, portions being taken in longitudinal section for purposes of clarity;

DETAILED DESCRIPTION OF PREFERRED EMBODIMENT

Figure 1:
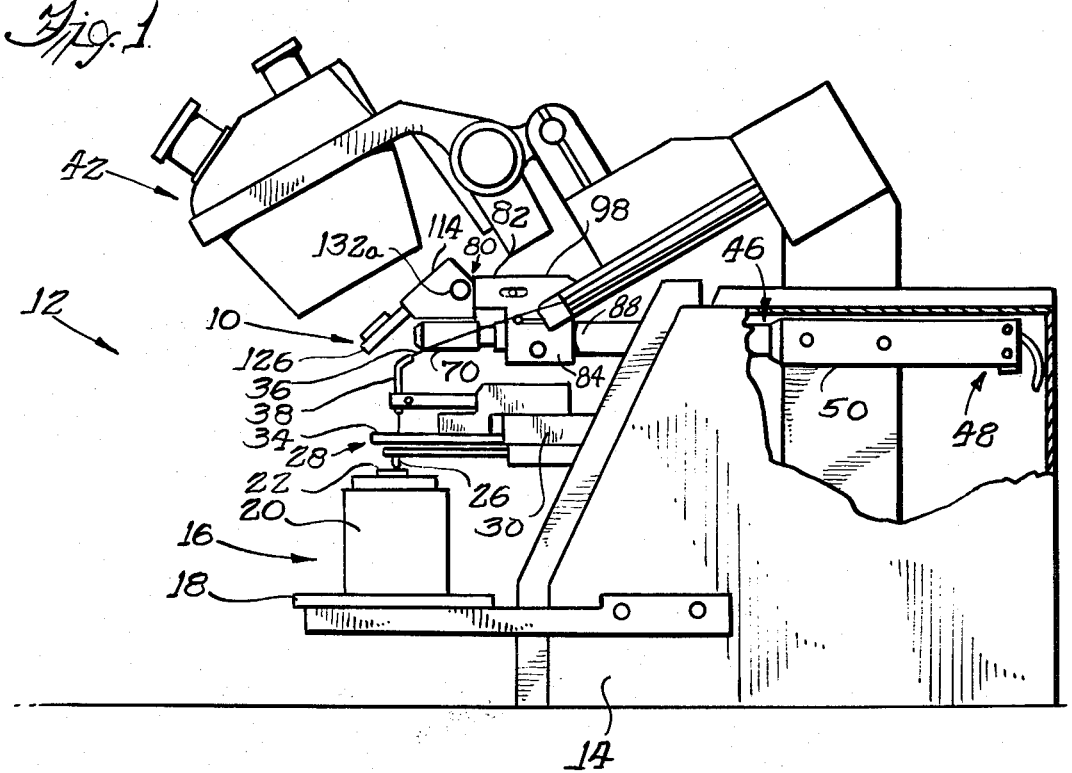
FIG. 1 is a side elevational view of a wire bonder apparatus incorporating a point of contact indicator device in accordance with the present invention.

Referring now to the drawings, and in particular to FIG. 1, a point of contact indicator device constructed in accordance with a preferred embodiment of the present invention is indicated generally at 10. The point of contact indicator device 10 is illustrated, by way of example, in conjunction with a wire bonder apparatus indicated generally at 12. The wire bonder may be of known design and includes a base frame 14 defining a work station, indicated generally at 16, having a support plate 18 adjustable in its own plane and adapted to support a work piece support fixture 20 having means for supporting a work piece 22 such as a microelectronic chip or wafer having one or more conductive elements thereon to which a conductive bonding wire is to be connected by a conventional wire bonding technique. The work piece support fixture 20 may be adapted to selectively heat the work piece if desired.

The wire bonder apparatus 12 includes tool means which, in the illustrated embodiment, takes the form of a porcelain capillary ball bonding tool 26 supported by a bonding head, indicated generally at 28. The bonding head 28 may be of substantially any known design such as available from The Micromanipulator Company, Inc., Carson City, Nev. Very briefly, the bonding head 28 includes a support arm 30 which supports the bonding tool 26 through an ultransonic transducer so that the bonding tool is spaced above the work station support plate 18 a sufficient distance to enable selective positioning of the work piece support fixture 20 and associated work piece 22 in predetermined underlying relation to the bonding tool. The support arm 30 carries a pair of clamping arms or fingers (not shown) adapted for selective movement between relative open and closed clamping positions operative to clamp or grip a continuous length of bonding wire 36 from a wound spool or other suitable source of bonding wire such that the bonding wire is guided downwardly through a guide tube 38 and through the tubular capillary bonding tool 26 to establish a tail or connector end which, in ball bonding, is formed into a ball for bond connection to a predetermined point on the work piece 22.

The bonding head 28 includes means (not shown) for moving the support arm 30 downwardly upon depressing an operating arm or lever so as to move the bonding tool from a first raised or "home" position spaced upwardly from the work piece to a downward bonding position wherein bonding contact is established between the exposed contact end of the bonding wire and the selected point on the upper surface of the work piece to which a bond connection is to be made. If desired, the bonding head 28 may also enable movement of the bonding tool to a position intermediate its fully raised "home" position and its lower bonding position, such intermediate position being termed the search level position and enabling more accurate positioning of the work piece by the operator preparatory to making a bond connection.

Preferably, an operator viewing aid in the form of a microscope, indicated generally at 42, is mounted on the base frame 14 in a position to enable operator viewing of the work piece and provide a magnified view which is particularly desirable in making bond contacts to microelectronic chips or wafers. It is conventional in wire bonder apparatus such as the illustrated wire bonder 12, to mount the microscope viewing aid such that the sight line is not impeded by any of the components of the bonding head. For this purpose, the microscope viewing aid is generally mounted so that the sight line is inclined from a line normal or perpendicualr to the upper surface of the work piece, such as at an angle in the range of approximately 15–20° from vertical. It will be appreciated that with the sight line of the microscope intersecting the work piece surface at an inclined angle and with the bonding tool spaced above the work piece, it is rather difficult and time consuming for even a trained operator to accurately position the work piece such that a predetermined point on the work piece lies precisely in the downward path of travel of the bonding tool as it is moved to its working position contacting the work piece.

The point of contact indicator device 10 is adapted to establish a target pattern directly on the upper surface of the work piece at substantially the precise point at which the bonding tool will make contact. This enables the operator to move the work piece through movement of the work station support plate 18 or work piece support fixture 20 and accurately position the work piece 22 so that the point or target indication established by the point of contact indicator device coincides with the exact spot on the work piece at which it is desired to make a bond connection.

Referring particularly to FIG. 2, the point of contact indicator device 10 includes housing means, indicated generally at 46, which, in the illustrated embodiment, takes the form of a generally stepped cylindrical housing to one end of which is mounted a high intensity light source, indicated generally at 48. The light source 48 has a generally cylindrically housing 50 connected in axially aligned relation to the right-hand end of the housing means 46. In the illustrated embodiment, the high intensity light source 48 comprises a commercially available helium-neon laser such as commercially available from Uniphase Company as its model No. 1108. A pair of longitudinally spaced generally rectangular brackets 50a and b are formed on or suitably connected to the laser housing 50 to facilitate connection to a mounting bracket which may be affixed to the base frame 14 of the wire bonder apparatus 12.

In the illustrated embodiment, the interconnected axially aligned housings 46 and 50 are supported so that the longitudinal axis of the point of contact indicator device extends substantially parallel to the plane of the upper surface on the work station support plate 18 and generally overlies the bonding head support arm 30 and associated ultrasonic transducer 32. The laser 48 is adapted to provide a 0.5 mm diameter beam which is passed through a first lens 54 suitably fixed, as by cementing, within a bore 56 formed in a support block 58 mounted within the right-hand end of the housing 46. The lens 54 is disposed transverse to the longitudinal axis of the housing 46 and is axially aligned therewith. The distance between lens 54 and the beam exit end of the laser 50 may be varied as desired. The lens 54 is an achromatic-type lens which serves to converge the laser beam to a pinhole 60 formed in an aperture plate 62 which serves to reduce the stray light.

From the pinhole aperture 60 the laser beam is expanded through a collimating lens 66 which is also an achromatic double type lens and serves to expand the laser beam into a beam of larger cross section having parallel rays. The lenses 54 and 66 and the pinhole 60 in aperture plate 62 and the associated portion of the tubular housing 46 comprises a beam expander.

The expanded laser beam from lens 66 is passed through a focusing lens 68 which may also be of the achromatic doublet type and which is supported within an adjustable tubular support member 70 having threaded connection with an externally threaded surface 72 on the forwardmost end of the housing means 46. The lens 68 serves to image the pinhole aperture 60 and serves as a focusing lens to enable focusing of the beam directed onto the work piece to form the point of contact indicator spot or target. In accordance with one feature of the present invention, the various lens combinations are selected so as to establish a relatively long focusing length outwardly from the focusing lens 68 which is in the order of approximately 87 mm. The focusing lens 68 is adapted to converge the parallel laser beam rays to a focal point which forms a circular spot or point of approximately 2 mil (0.002 inch).

In accordance with the invention, a mirror arrangement is provided adjacent the left-hand or high intensity beam emitting end of the housing 46 which is selectively adjustable to direct a point or target spot downwardly at a selected angle of incidence to the underlying work piece and in exacting predetermined relation to the touchdown or working position of the bonding tool 26 during a bond connect operation. The mirror support arrangement is indicated generally at 80 and includes an L-shaped housing 82 which includes a portion 84 having a cylindrical bore 86 adapted to receive and be fixed to a cylindrical portion 88 of the housing 46. The housing portion 84 preferably is bifurcated by a slot which enables the housing 84 to be tightened about the cylindrical housing portion 88 by a locking screw 94. An upper portion 98 of the housing 82 extends generally parallel to the axis of the laser beam housing 46 in spaced relation therefrom and has a cylindrical bore 100 in which is slidably supported a cylindrical support or mounting shaft 102. The shaft 102 has an internally threaded bore 104 which receives a threaded shank portion 106a of a thumb screw 106 in a manner to enable longitudinal adjustable positioning of the shaft 102 upon rotation of the thumb screw 106, the shaft 102 being prevented from rotating by a crosspin 108 received through a suitable elongated slot 110 in the housing 98.

Figure 3:
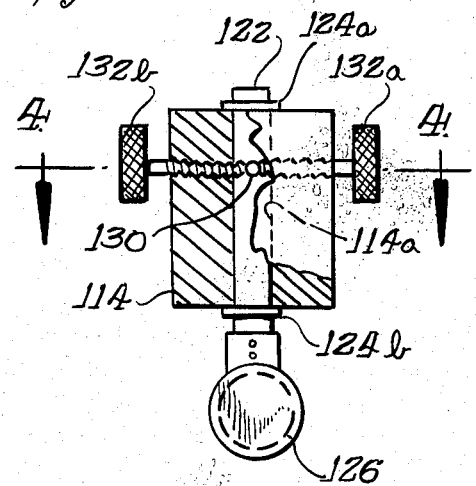
FIG. 3 is a front view of the mirror mounting arrangement, taken substantially along line 3—3 of FIG. 2 and looking in the direction of the arrows.
Figure 4:
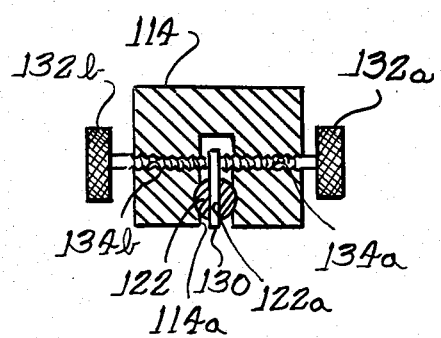
FIG. 4 is a transverse sectional view taken substantially along the line 4—4 of FIG. 3, looking in the direction of the arrows.

The support rod 102 extends forwardly from the housing 98 and has a mirror support block 114 fixed thereon so as to be movable with the support shaft 102 upon selective rotation of the thumb screw 106. A coil compression spring 116 is received within a counterbore 98a and acts against the support block 114 so as to urge the thumb screw head 106 against the housing 98. The mirror support block 114 has a cylindrical bore 120 formed therethrough which receives a cylindrical shaft 122, the shaft 122 being maintained in substantially fixed longitudinal relation within the bore 120 by suitable retainer rings 124a and 124b. The longitudinal axis of the cylindrical bore 120 lies in a plane containing the longitudinal axis of the support shaft 102 and the longitudinal axis of the high intensity light beam housing 46 and is angularly inclined relative to the axis of shaft 102 so as to form an included angle $\phi$ of approximately 42° therebetween. The shaft 122 extends downwardly from the support block 114 and supports a planar mirror 126 so that the reflective surface or face of the mirror lies in the path of the converging high intensity beam passing from the lens 68 so as to intercept the high intensity beam. The mirror 126 is positioned to reflect the high intensity beam down to a predetermined position coincident with the position of the lower end of the bonding tool 28 when in its lowered work or touchdown position with the underlying work piece. To facilitate positioning of the indicator spot in the event the bonding tool is replaced or other adjustments are necessary to accommodate different work pieces, means are provided to rotate the mirror 126 about the axis of the support shaft 122. Referring particularly to FIGS. 3 and 4, a control pin 130 is affixed within a suitable cross bore 122a in shaft 122 so as to lie in a Plane perpendicular to and containing the center of the mirror 126. The control pin 130 is positioned within a suitable bore 114a formed in support block 114 so as to enable rotation of support shaft 122. To facilitate manual selective rotation of shaft 122 and thereby enable adjustment of the reflective planar surface of mirror 126 relative to the longitudinal axis of the high intensity beam housing 46, a pair of thumb screws 132a and 132b have threaded connection with suitable threaded axially aligned bores 134a and 134b formed in the support block 114 transverse to and intersecting the bore 114a. In this manner, the thumb screws 132a,b may be selectively rotated to act on the control end 130 and effect selective rotation of the mirror support shaft 122.

By employing a high intensity light source such as the aforementioned helium-neon laser, significant advantages are provided over the known point of contact indicating techniques. For example, geometrical radiation losses are substantially eliminated. Because the light is naturally colored, no spectral losses are incurred. The laser has long life and therefore reduces maintenance costs incurred in relatively frequent changing of bulbs as required in incandescent type point of contact devices. Further advantages of the point of contact indicator device in accordance with the present invention include the ability to continuously adjust the intensity of the laser beam by rotating a filter (not shown) in front of the polarized laser beam and thereby enable optimum eye comfort for the operator. Still further, the beam may be deflected by means of two or more movable mirrors to create cross-line patterns or their desired point of contact patterns.

In accordance with the high intensity point of contact device of the invention, stray light surrounding the point of contact spot is eliminated by expanding the beam from the high intensity laser source into a larger area and then reforming the light to a point spot which is actually an image of the pinhole aperture in the beam expander. By placing the mirror 126 as aforedescribed, the specular component of the high intensity beam may be reflected back away from the operator so as not to impinge upon the operator's eye. By providing for adjustability of the mirror 126, the target spot on the work piece may be moved along the X and Y axes of the work piece, considered in a plane containing the upper surface of the work piece and parallel to the upper surface of the work station support plate 18. The tubular support 70 enables adjustment of the lens 68 so as to focus the spot at the surface of the work piece. By use of the mirror 126, the beam may be directed to the surface of the work piece at a low angle of incidence, such as approximately 6°, which results in low parallax errors as might result from bonding pads and conductive leads being of different heights.

While the present invention has been described as employing a helium-neon laser as the high intensity light source, it will be understood that other types of high-intensity light sources may also be employed. Other examples of high intensity light sources that might be employed in accordance with the present invention include solid-state lasers, dye lasers, solid-state light sources, concentrated zirconium arc lamps and carbon arc lamps.

While a preferred embodiment of the present invention has been illustrated and described, it will be understood that changes and modifications may be made therein without departing from the invention in its broader aspects. Various features of the invention are defined in the following claims.

What is claimed is:

1. An apparatus for creating a visually observable colored point of light on a workpiece illuminated with white light comprising:
   microscope means having a sight line enabling visual observation of the workpiece at an inclined angle to the vertical,
   a high intensity laser light source for establishing a high intensity colored light beam,
   means for converging the colored light beam substantially to a point of light,
   means for thereafter expanding the colored point of light,
   means for focusing the expanded colored point of light, and
   reflecting means positioned to intercept the focused point of light and to reflect the light beam at an angle of inclination to the workpiece to direct spectral light from the focused point of colored light from traveling along the line sight to eyes of the observer using the microscope means.

2. An apparatus in accordance with claim 1 in which the laser comprises a helium neon laser.

3. An apparatus in accordance with claim 1 in which the colored light beam is incident on the workpiece at an angle of about 6° to the vertical to reduce parallax errors.

4. A method for creating a visually observable colored point of light on a workpiece illuminated with white light and viewed under a microscope having a predetermined line of sight, said method comprising the steps of: establishing a high intensity light beam of colored light from a laser,
   converging the colored light beam substantially to a point of light,
   thereafter expanding the colored point of light,
   focusing the expanded colored point of light,
   reflecting the point of light and the light beam at an angle of inclination to the workpiece to direct spectral light from the focused point of colored light from traveling along the line sight to eyes of the observer using the microscope.

5. A method in accordance with claim 4 including operating a helium neon laser to establish the colored light beam.

6. A method in accordance with claim 4 including the step of directing the reflected light beam along a path incident on the workpiece at an angle of about 6° to the vertical to reduce parallax errors.

* * * * *